United States Patent
Cowley et al.

(10) Patent No.: US 9,735,765 B2
(45) Date of Patent: *Aug. 15, 2017

(54) APPARATUSES, METHODS, AND SYSTEMS FOR JITTER EQUALIZATION AND PHASE ERROR DETECTION

(71) Applicant: Intel Corporation, Santa Clara, CA (US)

(72) Inventors: Nicholas P. Cowley, Wroughton (GB); Chi Man Kan, Swindon (GB); Ruchir Saraswat, Swindon (GB)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/019,764

(22) Filed: Feb. 9, 2016

(65) Prior Publication Data
US 2016/0241223 A1   Aug. 18, 2016

Related U.S. Application Data

(63) Continuation of application No. 14/324,062, filed on Jul. 3, 2014, now Pat. No. 9,288,019.

(51) Int. Cl.
*H04B 3/46* (2015.01)
*H03K 5/13* (2014.01)
(Continued)

(52) U.S. Cl.
CPC ............. *H03K 5/13* (2013.01); *H03D 13/003* (2013.01); *H03L 7/097* (2013.01); *H04B 3/146* (2013.01);
(Continued)

(58) Field of Classification Search
None
See application file for complete search history.

(56) References Cited

U.S. PATENT DOCUMENTS

| 7,848,620 B2 | 12/2010 | Park |
| 2004/0120437 A1* | 6/2004 | Casper ............... H03K 5/135 375/355 |

(Continued)

OTHER PUBLICATIONS

Office Action and Search Report mailed Jul. 14, 2016 for Taiwan Application No. 104116977, 11 pages.

(Continued)

*Primary Examiner* — Adolf Dsouza
(74) *Attorney, Agent, or Firm* — Schwabe, Williamson & Wyatt, P.C.

(57) ABSTRACT

Embodiments include apparatuses, methods, and systems for jitter equalization and phase error detection. In embodiments, a communication circuit may include a data path to pass a data signal and a clock path to pass a clock signal. A jitter equalizer may be coupled with the data path and/or clock path to provide a programmable delay to the data signal and/or clock signal, respectively. The delay may be determined by a training process in which a supply voltage may be modulated by a modulation frequency. The delay may be dependent on a value of the supply voltage, such as a voltage level and/or jitter frequency component of the supply voltage. A phase error detector is also described that may be used with the communication circuit and/or other embodiments.

22 Claims, 5 Drawing Sheets

(51) Int. Cl.
*H04L 1/20* (2006.01)
*H03D 13/00* (2006.01)
*H04B 3/14* (2006.01)
*H03L 7/097* (2006.01)
*H03K 5/00* (2006.01)

(52) U.S. Cl.
CPC .... *H04L 1/205* (2013.01); *H03K 2005/00019* (2013.01)

(56) References Cited

U.S. PATENT DOCUMENTS

| | | | |
|---|---|---|---|
| 2009/0097588 A1* | 4/2009 | El-Agha | H04J 3/0602 375/295 |
| 2010/0129073 A1* | 5/2010 | Hamana | H04B 10/801 398/25 |
| 2012/0087452 A1* | 4/2012 | Zerbe | H04L 25/0264 375/354 |
| 2012/0293226 A1* | 11/2012 | Liao | H03L 7/0807 327/261 |

OTHER PUBLICATIONS

Non-Final Office Action mailed Jun. 29, 2015 for U.S. Appl. No. 14/324,062, 13 pages.
Notice of Allowance mailed Nov. 12, 2015 for U.S. Appl. No. 14/324,062, 7 pages.

\* cited by examiner

APPARATUSES, METHODS, AND SYSTEMS FOR JITTER EQUALIZATION AND PHASE ERROR DETECTION

CROSS REFERENCE TO RELATED APPLICATION

This application is a continuation of U.S. patent application Ser. No. 14/324,062, entitled "APPARATUSES, METHODS, AND SYSTEMS FOR JITTER EQUALIZATION AND PHASE ERROR DETECTION," filed on Jul. 3, 2014, and claims priority to the U.S. Ser. No. 14/324,062 application. The Specification of the U.S. Ser. No. 14/324,062 application is incorporated herein by reference.

FIELD

Embodiments of the present invention relate generally to the technical field of electronic circuits, and more particularly to jitter equalization and phase error detection.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Differential jitter between a clock signal and a data signal can lead to performance degradation in data interfaces both within an integrated circuit and between integrated circuits. In System-on-Chips (SoCs) that include a power delivery network (PDN), local switching currents may lead to local variations in the supply voltage received by circuit blocks of the SoC. The supply variation will lead to jitter being introduced as a result of modulation in the delay across the circuit block.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Figure 1:
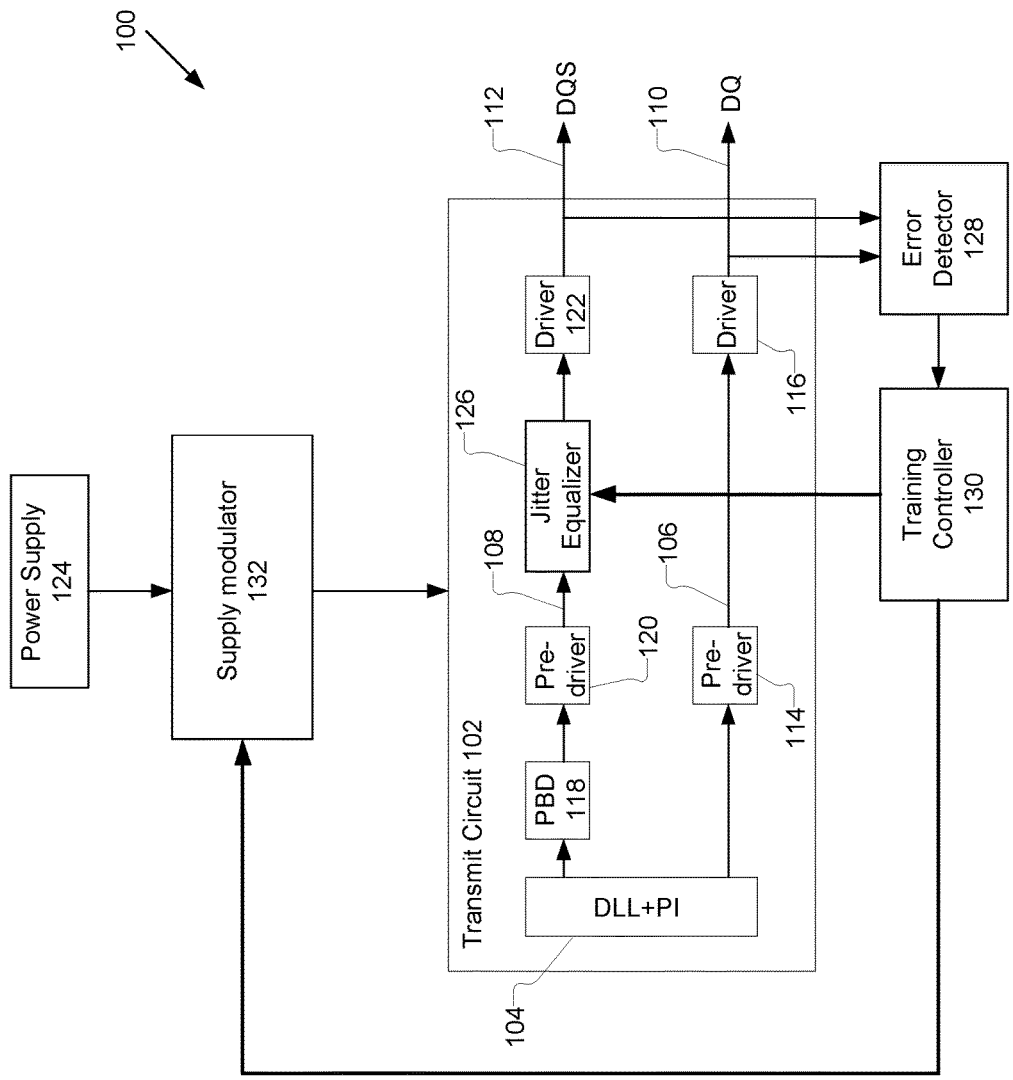
FIG. 1 schematically illustrates a communication circuit in accordance with various embodiments.

FIG. 1 schematically illustrates a circuit 100 (also referred to as "communication circuit 100") in accordance with various embodiments. The circuit 100 may include a transmit circuit 102 to transmit a data signal (DQ) and a clock signal (DQS, also referred to as a strobe signal). The transmit circuit 102 may be included, for example, in a high-speed input/output (HSIO) circuit to transmit the data signal and the clock signal. In some embodiments, the data signal may be a double data rate (DDR) data signal. In some embodiments, the circuit 100 may be included in a System-on-Chip (SoC) with one or more processors. The circuit 100 may be used to transmit the data signal and clock signal to one or more other components of the SoC and/or to one or more components external to the SoC.

In various embodiments, the transmit circuit 102 may include a delay locked loop (DLL) and phase interpolator (PI) circuit 104 to align the data signal and the clock signal. For example, in some embodiments, the clock signal may be aligned to be 90 degrees out of phase with the data signal. Additionally, or alternatively, the clock signal may have the same frequency as the data signal (e.g., half the data transfer rate for a DDR signal) in some embodiments.

The transmit circuit 102 may further include a data path 106 and a clock path 108 coupled to the DLL and PI circuit 104 to receive the data signal or clock signal, respectively.

The data path 106 may pass the data signal to a data output terminal 110 and the clock path 108 may pass the clock signal to a clock output terminal 112. In some embodiments, the transmit circuit 102 may include one or more additional signal paths to pass one or more additional data signals, clock signals, and/or other signals (e.g., a power signal). Although the jitter equalization techniques are described herein with reference to a single data signal and a single clock signal, it will be apparent that the jitter equalization techniques may be applied to reduce jitter between any number of signals. Additionally, the jitter equalization techniques may be applied to any types of signals for which it is desired to reduce jitter (e.g., two data signals).

In various embodiments, the data path 106 may include one or more circuit blocks to process the data signal and pass the processed data signal to the data output terminal 110. For example, the data path 106 may include a pre-driver circuit 114 and a driver circuit 116 coupled between the DLL and PI circuit 104 and the data output terminal 110. Additionally, the clock path 108 may include one or more circuit blocks to process the clock signal and pass the processed clock signal to the clock output terminal 112. For example, the clock path 108 may include a per bit deskew (PBD) circuit 118, a pre-driver circuit 120, and a driver circuit 122 coupled between the DLL and PI circuit 104 and the clock output terminal 112.

In various embodiments, the data circuit 102 may be coupled to a power supply 124 to receive a supply voltage. The supply voltage may be used to power the pre-driver circuit 114, the driver circuit 116, the PBD circuit 118, the pre-driver circuit 120, and/or the driver circuit 122. In some embodiments, the supply circuit 124 may be a power delivery network (PDN). The PDN may include multiple power nodes to deliver power to one or more circuit blocks of the circuit 100. Due to the nature of PDNs, the magnitude of the supply voltage received by the circuit blocks of the data path 106 and/or clock path 108 may vary over time and/or between circuit blocks. Additionally, switching of circuit blocks coupled with the power supply 124 may cause modulation of the supply voltage (e.g., supply noise). The variation in the supply voltage may lead to jitter (e.g., differential jitter between the data signal and clock signal) being introduced as a result of the modulation in the delay across a circuit block. For example, an increasing supply voltage may lead to a decrease in gate transition delay, which may cause signals to propagate to the output of the circuit block in a shorter time.

In some embodiments, the power supply 124 may provide a plurality of supply voltages. For example, the power supply 124 may include an analog supply and a digital supply.

In various embodiments, the circuit 100 may include a jitter equalizer 126 coupled with the clock path 108 to introduce a delay to the clock signal to provide a pre-determined alignment between the clock signal and the data signal (e.g., 90 degrees out of phase). In various embodiments, the amount of the delay provided by the jitter equalizer 126 may be dependent on a value of the supply voltage received by the jitter equalizer 126. For example, the amount of the delay may change with a change in the voltage level of the supply voltage. Additionally, or alternatively, in some embodiments, the amount of the delay may change with a change in a modulation frequency of the supply voltage. The modulation frequency of the supply voltage may correspond to the frequency of the jitter caused by the modulation of the supply voltage. Accordingly, the jitter equalizer 126 may compensate for variations in the supply voltage to reduce differential jitter between the data signal and the clock signal.

In various embodiments, the jitter equalizer 126 may be programmable to provide a pre-determined change in delay with respect to a change in supply voltage. In some embodiments, the jitter equalizer 126 may be able to provide a positive or negative delay.

Although the jitter equalizer 126 is shown coupled with the clock path 108, in some embodiments the jitter equalizer 126 may be coupled with the data path 106 in addition to or instead of being coupled with the clock path 108. For example, in some embodiments, the jitter equalizer 126 may be capable of introducing a positive delay to either the data path 106 or clock path 108.

In various embodiments, the amount of delay to be provided by the jitter equalizer 126 may be determined by a training process. The circuit 100 may include an error detector 128 (also referred to as a phase error detector), a training controller 130, and/or a supply modulator 132 to perform the training process. During the training process, the supply modulator 132 may modulate the supply voltage at a modulation frequency. The modulation may cause jitter in the data signal and/or clock signal.

The error detector 128 may be coupled to the data circuit 102 to receive the data signal and the clock signal. The error detector 128 may measure a phase error between the first and second signals that is caused by the modulation of the supply voltage. The phase error may correspond to a difference of the phase difference between the data signal and the clock signal while the supply voltage is modulated and the baseline (e.g., desired) phase difference prior to the supply modulation (e.g., 90 degrees phase difference). The training controller 130 may adjust a delay setting of the jitter equalizer 126 based on the measured phase error (e.g., using a feedback control loop) to obtain a calibrated delay setting.

In some embodiments, the training controller 130 may obtain calibrated delay settings for multiple modulation frequencies of the supply voltage. The delay provided by the jitter equalizer 126 may vary with the frequency of the supply voltage, based on the plurality of calibrated delay settings.

In some embodiments, a pre-determined data pattern may be used for the data signal during the training process. For example, in some embodiments, the data signal may be an alternating sequence of logic 0 bits and logic 1 bits (e.g., a 10101010 . . . sequence).

In various embodiments, the circuit 100 may reduce the differential jitter between the data signal and the clock signal that is caused by variation in the supply voltage (e.g., magnitude and/or frequency noise variation). The reduced jitter may reduce the eye closure for a given architecture of the transmit circuit 102, thereby facilitating a higher clock rate and/or a lower bit error rate (BER) for the transmit circuit 102. Alternatively, or additionally, the reduced jitter may allow the specifications for circuit blocks of the transmit circuit 102 to be relaxed, thereby providing, for example, reduced design complexity, power usage, and/or area usage.

Figure 2:
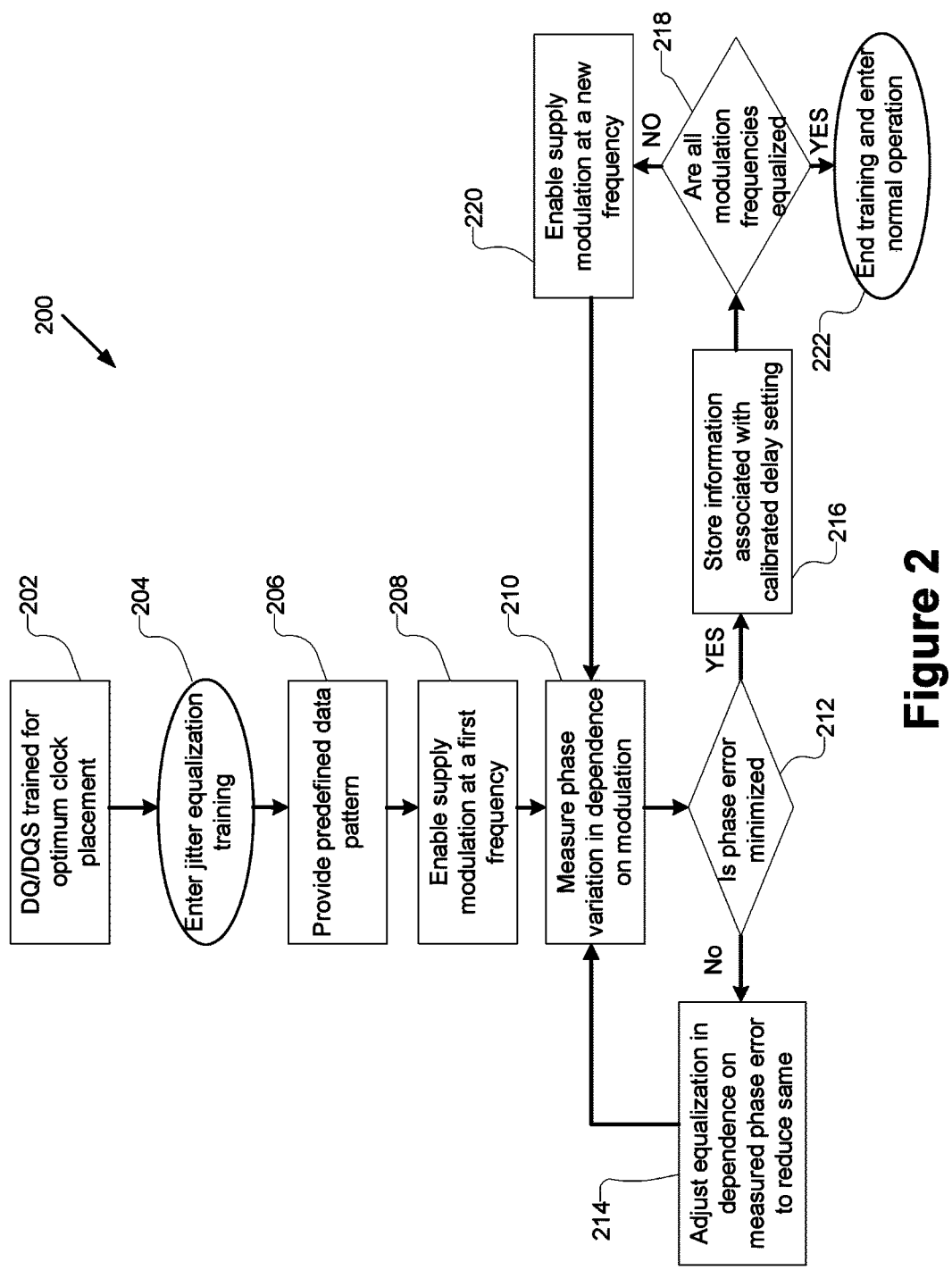
FIG. 2 illustrates an example training process in accordance with various embodiments.

FIG. 2 illustrates an example training process 200 in accordance with various embodiments. The training process 200 may be used to calibrate a delay provided by a jitter equalizer (e.g., jitter equalizer 126). In some embodiments, the training process 200 may be performed by a communication circuit, such as the circuit 100. In some embodiments, an apparatus may include one or more computer-readable media having instructions, stored thereon, that when executed cause the computing device to perform one or more operations of the training process 200.

At 202 of the training process 200, the data (DQ) and clock (DQS) signals may be trained for optimum placement of the clock signal (e.g., relative to the data signal). The training at 202 may provide the desired alignment between the clock signal and the data signal (e.g., 90 degrees phase difference). In some embodiments, the training at 202 may be performed using a DLL and PI circuit (e.g., DLL and PI circuit 104).

At 204 of the training process 200, the communication circuit may enter the jitter equalization training.

At 206 of the training process 200, the communication circuit may provide a pre-defined data pattern for the data signal (e.g., an alternating sequence of logic 0 bits and logic 1 bits).

At 208 of the training process 200, the transmit circuit may enable modulation of the supply voltage at a first frequency. The modulation may be performed by a supply modulator (e.g., supply modulator 132) of the transmit circuit. The first frequency may include, for example, a harmonic frequency of the transmit circuit. In some embodiments, the communication circuit may modulate the supply voltage at a plurality of frequencies simultaneously (e.g., a range of frequencies).

At 210 of the training process 200, the transmit circuit may measure a phase error in dependence on (e.g., caused by) the modulation. The phase error may correspond to, for example, the variation in the phase relationship between the data signal and the clock signal after the supply voltage is modulated compared with the phase relationship between the data signal and the clock signal before the supply voltage is modulated. The phase error may be determined, for example, by an error detector (e.g., error detector 128) of the transmit circuit.

Figure 3:
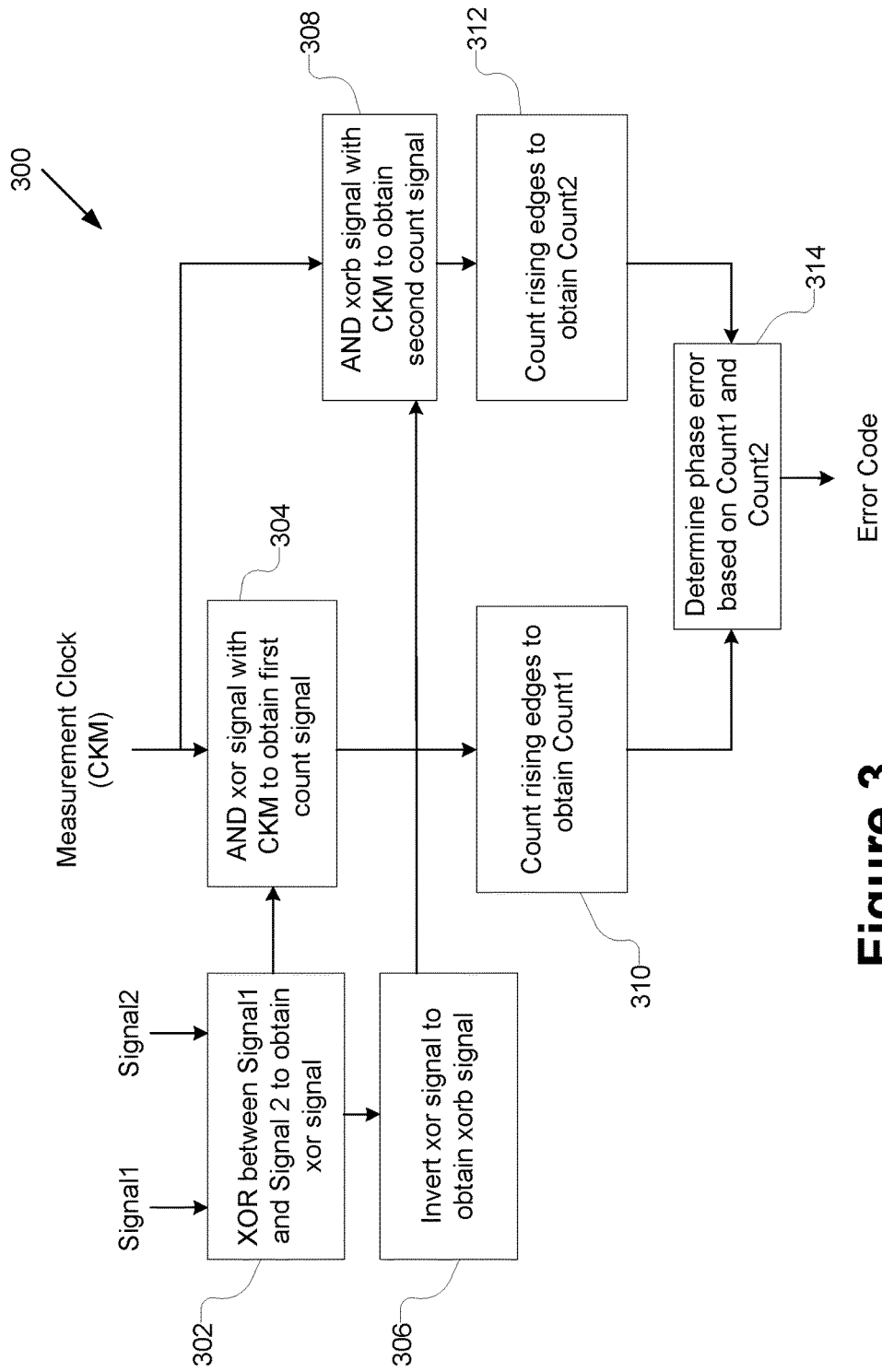
FIG. 3 illustrates an example phase error detection process in accordance with various embodiments.
Figure 4:
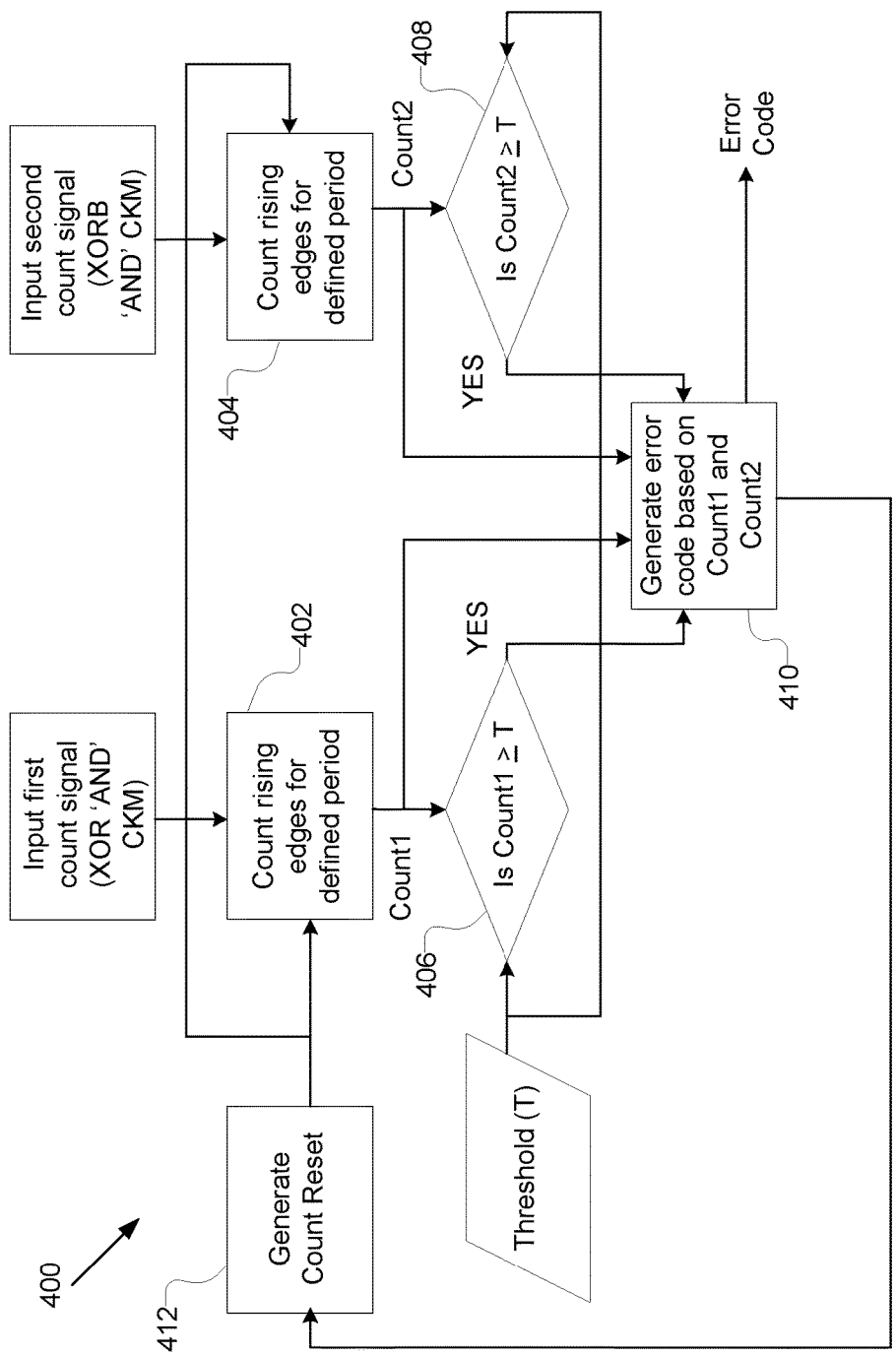
FIG. 4 illustrates another example phase error detection process in accordance with various embodiments.

In some embodiments, the error detector may determine a baseline alignment (e.g., phase difference) between the data signal and the clock signal prior to modulating the supply voltage at 208. The error detector may determine the phase error based on the determined baseline alignment. In some embodiments, the pre-defined data pattern may be provided as the data signal while the error detector determines the baseline alignment. Further details of the functionality of example error detectors are shown in FIGS. 3 and 4 and discussed below.

At 212 of the training process 200, the communication circuit may determine if the phase error between the data signal and the clock signal is minimized. If the phase error is determined to not be minimized, then, at 214 of the training process 200, the communication circuit may adjust the equalization (e.g., delay) provided by the jitter equalizer based on the measured phase error (e.g., to reduce the phase error), and the training process 200 may return to block 210 to again measure the phase error.

If the phase error is determined at block 212 to be minimized, then, at 216 of the training process 200, the communication circuit may store information associated with the delay setting of the jitter equalizer that resulted in the phase error being minimized. The information may include, for example, one or more coefficients associated with the delay setting and/or the modulation frequency associated with the delay setting. This delay setting may be referred to as a calibrated delay setting. In some embodiments, the delay setting may correspond to a change in delay provided by the jitter equalizer for a given change in the voltage level of the supply voltage (e.g., Δdelay/Δvoltage).

In some embodiments, the training process 200 may include determining calibrated delay settings for a plurality of modulation frequencies. In these embodiments, at 218 of the training process 200, the communication circuit may determine if all of the plurality of modulation frequencies have been equalized (e.g., if a calibrated delay setting has been determined for all of the modulation frequencies). If all of the modulation frequencies have not yet been equalized, the transmit circuit, at 220 of the training process 200, may modulate the supply voltage at another frequency of the set of modulation frequencies (e.g., at a second frequency) and return to block 210 of the training process 200 to measure the phase error at the second modulation frequency.

If all of the modulation frequencies of the set of modulation frequencies have been equalized, then, at 222 of the training process 200, the communication circuit may end the training process 200 and enter normal operation of the communication circuit. During the normal operation, the jitter equalizer may provide a delay to the data signal and/or clock signal that is based on the one or more calibrated delay settings determined during the training process 200.

The delay provided by the jitter equalizer may vary with a detected modulation frequency or frequencies of the supply voltage based on the calibrated delay settings obtained for the plurality of modulation frequencies in the training process 200. For example, delay settings for modulation frequencies other than the modulation frequencies for which calibrated delay settings were obtained may be extrapolated from the calibrated delay settings. In some embodiments, a jitter equalization function may be generated, based on the calibrated delay settings, that varies the delay based on the modulation frequency of the supply voltage. The jitter equalizer may provide the delay based on the jitter equalization function.

In other embodiments, the training process 200 may determine the calibrated delay setting for a single modulation frequency. In some embodiments, the jitter caused by supply modulation may vary only slightly over a normal range of supply modulation frequencies that is seen during operation of the communication circuit. Accordingly, the same calibrated delay setting may be used for all frequencies of supply modulation.

In various embodiments, the calibrated delay needed to compensate for variation in the supply voltage may remain substantially constant for a given process, voltage and/or temperature associated with the communication circuit. In some embodiments, the training process 200 may be repeated if one or more parameters (e.g., temperature) exceed an associated threshold. Additionally, or alternatively, the training process 200 may be repeated periodically. Furthermore, in some embodiments, as discussed further below, the differential jitter between the data signal and the clock signal may be monitored during normal operation of the communication circuit. If the jitter exceeds a threshold, the training process 200 may be performed.

Referring again to FIG. 1, in some embodiments, the error detector 128 may perform an XOR (exclusive OR) operation between the data signal and the clock signal to generate an xor signal. The error detector 128 may determine the phase error between the data signal and the clock signal based on the xor signal. The xor signal may have a mark/space ratio that varies based on the phase error between the data signal and the clock signal. The mark/space ratio may be a ratio, measured over a given total time period, of a first time period for which the xor signal has a first logic level (e.g., logic 1) compared with a second time period for which the xor signal has a second logic level (e.g., logic 0). The mark/space ratio may correspond to the duty cycle of the xor signal.

When the clock signal is aligned at a 90 degree phase difference with the data signal, the mark/space ratio may be 50:50. However, differential jitter between the clock signal and the data signal may change the mark/space ratio. Accordingly, the phase error between the data signal and the clock signal may be determined based on the mark/space ratio of the xor signal. While the phase error detection process is discussed herein as using an XOR operation between the data signal and the clock signal, it will be apparent that other logical operations may be performed to arrive at the same or similar results.

FIG. 3 illustrates a phase error detection process 300 that may be performed by a phase error detector (e.g., error detector 128), in accordance with various embodiments. In some embodiments, the operation of measuring the phase error in block 210 of training process 200 may include performing one or more operations of the phase error detection process 300. In some embodiments, an apparatus may include one or more computer-readable media having instructions, stored thereon, that when executed cause the computing device to perform one or more operations of the phase error detection process 300.

In various embodiments, the phase error detector may receive a first signal (Signal1) and a second signal (Signal2) between which the phase error is to be detected. The first signal may be, for example, the data signal, and the second signal may be, for example, the clock signal.

The phase error detector may also receive a measurement clock (CKM). In some embodiments, the measurement clock may be uncorrelated and/or harmonically unrelated to the first and/or second signals. In some embodiments, a frequency of the measurement clock may be higher than a frequency of the first signal and/or a frequency of the second signal.

At 302 of the phase error detector process 300, the phase error detector may perform an XOR operation between the first signal and the second signal to obtain an xor signal.

At 304 of the phase error detector process 300, the phase error detector may perform an AND operation between the xor signal and the measurement clock to obtain a first count signal. The AND operation may gate the measurement clock with the xor signal, so that the resulting first count signal has a value of logic 1 only when both the xor signal and the measurement clock have values of logic 1.

At 306 of the phase error detection process 300, the phase error detector may invert the xor signal to obtain an xorb signal. At 308 of the phase error detection process 300, the phase error detector may perform an AND operation between the xorb signal and the measurement clock signal to obtain a second count signal.

At 310 of the phase error detection process 300, the phase error detector may count a number, Count1, of rising edges in the first count signal over a pre-determined time period.

At 312 of the phase error detection process 300, the phase error detector may count a number, Count2, of rising edges in the second count signal over the pre-determined time period. In various embodiments, the relative value of Count1 compared with Count 2 may correspond to the mark/space ratio of the xor signal.

At 314 of the phase error detection process 300, the phase error detector may determine a phase error between the first and second signals based on Count1 and Count2. The phase error detector may generate and output an error code that corresponds to the phase error.

For example, if the desired alignment between the first and second signals corresponds to a 50:50 mark/space ratio of the xor signal (for example, if the clock signal is aligned to have a 90 degree phase difference with the data signal), the Count1 and Count 2 will have the same value when the first and second signals have the desired alignment. Accordingly, the phase error detector may determine the phase error based on a comparison (e.g., difference) between Count1 and Count2.

In some embodiments, the error code may indicate a magnitude and/or sense (e.g., direction from the desired alignment) of the determined phase error. As discussed herein, a communication circuit (e.g., communication circuit 100) may adjust a delay provided by a jitter equalizer (e.g., jitter equalizer 126) based on the error code generated by the phase error detector, thereby reducing the differential jitter between the first and second signals.

In some embodiments, the phase error detector may obtain baseline values of Count1 and Count2 before modulating the supply voltage. The transmit circuit may provide the pre-defined data pattern as the data signal (e.g., an alternating sequence of logic 0 bits and logic 1 bits) while the baseline values of the Count1 and Count2 values are obtained. The transmit circuit may then modulate the supply voltage and obtain new values of Count1 and Count2. The phase error detector may determine the phase error based on the new values of Count1 and Count2 relative to the baseline values of Count1 and Count2.

In some embodiments, the phase error detector may output the error code responsive to a determination that a phase error between the first and second signals has reached or exceeded a threshold. For example, the phase error detector may maintain an up/down counter. Count1 may increment the up/down counter, and Count2 may decrement the up/down counter. The phase error detector may output the error code when a magnitude (e.g., absolute value) of the value of the up/down counter meets or exceeds a threshold.

In these embodiments, the delay provided by the jitter equalizer may be changed only when the phase error between the first and second signals reaches or exceeds the threshold. Furthermore, in some embodiments, the phase error detector may monitor the jitter during normal operation of the communication circuit and initiate a change in the delay setting of the jitter equalizer if the monitored jitter reaches or exceeds the threshold.

FIG. 4 illustrates another phase error detection process 400 (also referred to as "process 400") that may be performed by a phase error detector (e.g., phase error detector 128) in accordance with various embodiments. In some embodiments, the operation of measuring the phase error in block 210 of training process 200 may include performing one or more operations of the phase error detection process 400. In some embodiments, an apparatus may include one or more computer-readable media having instructions, stored thereon, that when executed cause the computing device to perform one or more operations of the phase error detection process 400.

In various embodiments, the phase error detector may receive the first and second count signals. The phase error detector may also generate the first and second count signals as discussed herein. The first count signal may be the result of an AND operation between an xor signal and a measurement clock signal (CKM). The xor signal may be the result of an XOR operation between a first signal (e.g., a data signal) and a second signal (e.g., a clock signal) between which the phase error is to be measured.

The second count signal may be the result of an AND operation between an xorb signal and the measurement clock signal. The xorb signal may be an inverse of the xor signal.

At 402 of the process 400, the phase error detector may count rising edges of the first count signal to obtain a first counter value Count1. The phase error detector may additionally, at 404 of the process 400, count rising edges of the second count signal to obtain a second counter value Count2. In other embodiments, the phase error detector may count falling edges and/or all transitions of the first and/or second count signals.

At 406, the phase error detector may determine if Count1 is equal to or greater than a threshold (T). At 408, the phase error detector may determine if Count2 is equal to or greater than the threshold.

If either Count1 or Count2 is equal to or greater than the threshold, the phase error detector may trigger the generation of an error code at 410 of the process 400. In some embodiments, the error code may indicate which counter value (e.g., Count1 or Count2) reached the threshold first and the magnitude of the difference between Count1 and Count2 when the threshold was reached.

The phase error detector may also trigger a reset of the counter values Count1 and Count2 if either Count1 or Count2 is equal to or greater than the threshold.

At 412 of the process 400, the phase error detector may trigger a reset of the counter values Count1 and Count2. The reset of Count1 and Count2 may also be triggered by either Count1 or Count2 being equal to or greater than the threshold.

In various embodiments, the phase error detection process 400 may be asynchronous and may not require the phase error detector to count the rising edges of the first and second count signals for a defined time period.

In various embodiments, the phase error detection processes 300 and/or 400, that may be employed by the error detector 128, may be purely digital processes that do not require any analog circuit blocks or delay cells. The digital implementation of the phase error detection processes 300 and/or 400 may facilitate node migration of the circuit 100 (e.g., changing the process node), whereas analog components often require a significant re-design when the process node is changed.

Additionally, or alternatively, the phase error detection processes 300 and/or 400 may be tolerant of variation in PVT corners, and may not require calibration. Furthermore, the phase error detection processes 300 and/or 400 may be tolerant of differences in the baseline mark/space ratio of the xor and/or xorb signals. For example, the phase error detection processes 300 and/or 400 may normalize the measured phase error based on the baseline mark/space ratio, thereby allowing the phase error to be properly measured even if the desired alignment of the clock signal and the data signal corresponds to a mark/space ratio of the xor and/or xorb signals that is not 50:50 (e.g., 60:40).

Figure 5:
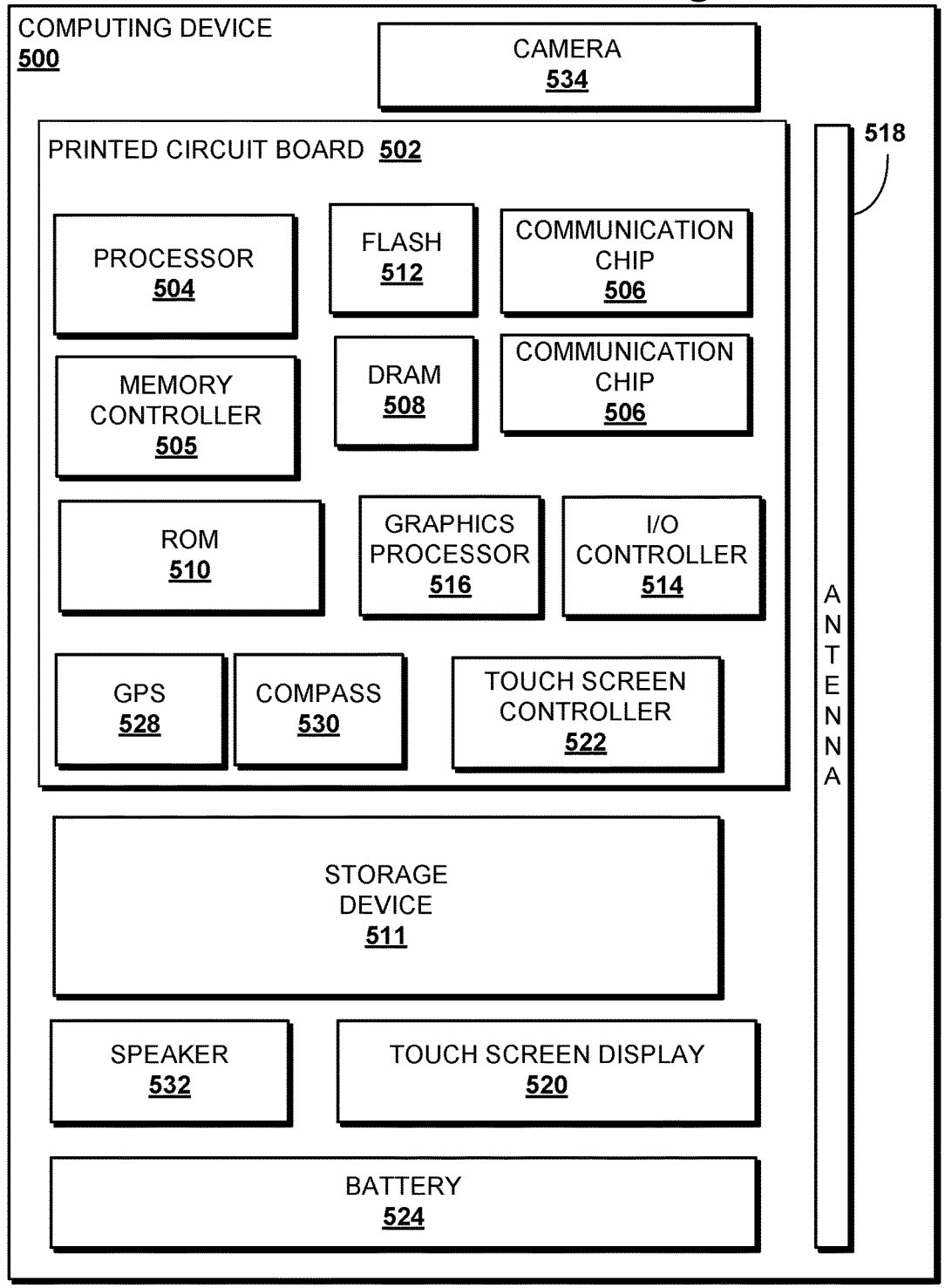
FIG. 5 illustrates an example system configured to employ the apparatuses and methods described herein, in accordance with various embodiments.

FIG. 5 illustrates an example computing device 500 that may employ the apparatuses and/or methods described herein (e.g., circuit 100, training process 200, phase detection process 300, phase detection process 400), in accordance with various embodiments. As shown, computing device 500 may include a number of components, such as one or more processor(s) 504 (one shown) and at least one communication chip 506. In various embodiments, the one or more processor(s) 504 each may include one or more processor cores. In various embodiments, the at least one communication chip 506 may be physically and electrically coupled to the one or more processor(s) 504. In further implementations, the communication chip 506 may be part of the one or more processor(s) 504. In various embodiments, computing device 500 may include printed circuit board (PCB) 502. For these embodiments, the one or more processor(s) 504 and communication chip 506 may be disposed thereon. In alternate embodiments, the various components may be coupled without the employment of PCB 502.

Depending on its applications, computing device 500 may include other components that may or may not be physically and electrically coupled to the PCB 502. These other components include, but are not limited to, memory controller 505, volatile memory (e.g., dynamic random access memory (DRAM) 508), non-volatile memory such as read only memory (ROM) 510, flash memory 512, storage device 511 (e.g., a hard-disk drive (HDD)), an I/O controller 514, a digital signal processor (not shown), a crypto processor (not shown), a graphics processor 516, one or more antenna 518, a display (not shown), a touch screen display 520, a touch screen controller 522, a battery 524, an audio codec (not shown), a video codec (not shown), a global positioning system (GPS) device 528, a compass 530, an accelerometer (not shown), a gyroscope (not shown), a speaker 532, a camera 534, and a mass storage device (such as hard disk drive, a solid state drive, compact disk (CD), digital versatile disk (DVD)) (not shown), and so forth. In various embodiments, the processor 504 may be integrated on the same die with other components to form a System on Chip (SoC).

In some embodiments, the one or more processor(s) 504, flash memory 512, and/or storage device 511 may include associated firmware (not shown) storing programming instructions configured to enable computing device 500, in response to execution of the programming instructions by one or more processor(s) 504, to practice all or selected aspects of the methods described herein (e.g., training process 200, phase error detection process 300, phase error detection process 400). In various embodiments, these aspects may additionally or alternatively be implemented using hardware separate from the one or more processor(s) 504, flash memory 512, or storage device 511.

In various embodiments, one or more components of the computing device 500 may include the circuit 100 and/or error detector 128 described herein. For example, the circuit 100 and/or error detector 128 may be included in I/O controller 514, processor 504, memory controller 505, and/or another component of computing device 500. In some embodiments, I/O controller 514 may interface with one or more external devices to transmit a data signal using the circuit 100 and/or transmit circuit 102. In other embodiments, the circuit 100 and/or transmit circuit 102 may be used to transmit and/or receive a data signal between two components of the computing device 500.

The communication chips 506 may enable wired and/or wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 500 may be any other electronic device that processes data.

Some non-limiting Examples are provided below.

Example 1 is a communication circuit comprising: a first transmission path to pass a first signal, the first transmission path including one or more circuit blocks to receive a supply voltage and to process the first signal; a second transmission path to pass a second signal, the second transmission path including one or more circuit blocks to receive the supply voltage and to process the second signal; and a jitter equalizer coupled with the first transmission path to introduce a delay to the first signal to provide an alignment between the first and second signals, wherein an amount of the delay is based on a value of the supply voltage.

Example 2 is the circuit of Example 1, wherein the first signal is a clock signal and the second signal is a data signal.

Example 3 is the circuit of Example 1, further comprising: an error detector to measure a phase error between the first and second signals; and a training controller to adjust a delay setting of the jitter equalizer based on the measured phase error to obtain a calibrated delay setting.

Example 4 is the circuit of Example 3, further comprising a supply modulator to modulate the supply voltage by a modulation frequency during a training process of the circuit.

Example 5 is the circuit of Example 4, wherein the modulation frequency is a first modulation frequency, wherein the calibrated delay setting is associated with the first modulation frequency, wherein the supply modulator is further to modulate the supply voltage at a second modulation frequency, and wherein the training controller is to obtain a second calibrated delay setting associated with the second modulation frequency.

Example 6 is the circuit of Example 4, wherein the training controller is to re-initiate the training process if a temperature associated with the circuit exceeds a respective threshold.

Example 7 is the circuit of Example 4, wherein the circuit is to provide a pre-determined data pattern for the data signal during the training process.

Example 8 is the circuit of any one of Examples 3 to 7, wherein the error detector is to: perform an xor operation between the first and second signals to generate an xor signal; and determine a phase error between the first and second signals based on a mark/space ratio of the xor signal.

Example 9 is the circuit of Example 8, wherein the error detector is to determine the phase error based on the mark/space ratio of the xor signal by being configured to: perform a logic and operation between the xor signal and an uncorrelated clock signal to generate a first count signal; perform a logic and operation between an xorb signal and the uncorrelated clock signal to generate a second count signal, the xorb signal being an inverted version of the xor signal; and determine the phase error between the first and second signals based on a difference between a first number of transitions in the first count signal and a second number of transitions in the second count signal.

Example 10 is the circuit of Example 1, wherein the value of the supply voltage is a voltage level of the supply voltage.

Example 11 is a phase error detection circuit comprising: a first input terminal to receive a first input signal; a second input terminal to receive a second input signal; and a phase error detector coupled to the first and second input terminals. The phase error detector is to: perform an XOR operation between the first and second input signals to generate an xor signal; and determine a phase error between the first and second input signals based on a mark/space ratio of the xor signal.

Example 12 is the circuit of Example 11, wherein the phase error detector is to determine the phase error based on the mark/space ratio of the xor signal by being configured to: perform a logic AND operation between the xor signal and a clock signal to generate a first count signal; perform a logic AND operation between an xorb signal and the clock signal to generate a second count signal, the xorb signal being an inverted version of the xor signal; and determine the phase error between the first and second input signals based on a difference between a first number of transitions in the first count signal and a second number of transitions in the second count signal over a same time period.

Example 13 is the circuit of Example 12, wherein the clock signal is uncorrelated with the first or second input signals.

Example 14 is the circuit of Example 12, wherein the phase error detector is to generate an error code that corresponds to the determined phase error, and wherein the circuit further comprises a training controller coupled to the phase error detector, the training controller to adjust a delay of the first or second input signal based on the error code.

Example 15 is the circuit of Example 12, wherein the phase error detector is to generate an error code that corresponds to the determined phase error responsive to a determination that a difference between the first number of transitions and the second number of transitions is equal to or greater than a threshold.

Example 16 is the circuit of Example 12, wherein the phase error detector is further to: count the first number of transitions and the second number of transitions for a pre-determined time period; and generate an error code to indicate a sense and a magnitude of the phase error.

Example 17 is the circuit of Example 12, wherein the phase error detector is to: determine that that the first number of transitions or the second number of transitions is equal to or greater than a threshold; and generate an error code to indicate a sense and magnitude of the phase error responsive to the determination.

Example 18 is a computing system, comprising: a touchscreen display; a processor coupled to the touchscreen display; a power supply to provide a supply voltage; and a communication circuit coupled to the processor and to the power supply. The communication circuit includes: a supply modulator to modulate the supply voltage at a modulation frequency during a training process of the communication circuit; a data path to pass a data signal, the data path including one or more circuit blocks to process the data signal; a clock path to pass a clock signal, the clock path including one or more circuit blocks to process the clock signal; a jitter equalizer coupled with the data path or the clock path to provide a delay to the respective data signal or clock signal; an error detector to measure a phase error between the data signal and the clock signal; and a training controller to, while the supply voltage is modulated at the modulation frequency, adjust the delay provided by the jitter equalizer based on the measured phase error.

Example 19 is the system of Example 18, wherein the modulation frequency is a first modulation frequency, wherein the training controller is further to, while the supply voltage is modulated at a second modulation frequency, adjust the delay provided by the jitter equalizer based on the measured phase error.

Example 20 is the system of Example 18, wherein the delay provided by the jitter equalizer varies with a voltage level of the supply voltage.

Example 21 is the system of any one of Examples 18 to 20, wherein the delay provided by the jitter equalizer varies with a frequency of a jitter component of the supply voltage.

Example 22 is a method for phase error detection, the method comprising: performing a logic XOR operation between first and second input signals to generate an xor signal; performing a logic AND operation between the xor signal and a clock signal to generate a first count signal; performing a logic AND operation between an xorb signal and the clock signal to generate a second count signal, the xorb signal being an inverted version of the xor signal; counting a number of rising edges in the first count signal for a time period to obtain a first counter value; counting a number of rising edges in the second count signal for a time period to obtain a second counter value; determining a phase error between the first and second input signals based on the first and second counter values.

Example 23 is the method of Example 22, further comprising generating an error code that indicates a magnitude and a sense of the determined phase error.

Example 24 is the method of Example 23, further comprising: determining that a difference between the first and second counter values is equal to or greater than a threshold; and outputting the error code responsive to the determination that the difference is equal to or greater than the threshold.

Example 25 is the method of Example 23, further comprising: determining that the first counter value or the second counter value is equal to or greater than a threshold; and outputting the error code responsive to the determination that the first counter value or the second counter value is equal to or greater than the threshold.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A circuit, comprising:
   a supply modulator to modulate a supply voltage at a modulation frequency during a training process of the circuit;
   a transmit circuit coupled to the supply modulator to receive the supply voltage, the transmit circuit including:
   a data path to pass a data signal;
   a clock path to pass a clock signal;
   a jitter equalizer coupled with the data path or the clock path to provide a delay to the respective data signal or clock signal;
   an error detector to measure a phase error between the data signal and the clock signal; and
   a training controller to, while the supply voltage is modulated at the modulation frequency, adjust the delay provided by the jitter equalizer based on the measured phase error.

2. The circuit of claim 1, wherein the modulation frequency is a first modulation frequency, wherein the training controller is further to, while the supply voltage is modulated at a second modulation frequency, adjust the delay provided by the jitter equalizer based on the measured phase error.

3. The circuit of claim 1, wherein the delay provided by the jitter equalizer varies with a voltage level of the supply voltage.

4. The circuit of claim 1, wherein the delay provided by the jitter equalizer varies with a frequency of a jitter component of the supply voltage.

5. The circuit of claim 1, wherein the jitter equalizer is coupled to the data path.

6. The circuit of claim 1, wherein the jitter equalizer is coupled to the clock path.

7. The circuit of claim 1, wherein the error detector is to:
   perform an XOR operation between the data signal and the clock signal to generate an xor signal; and
   determine the phase error between the data signal and the clock signal based on a mark/space ratio of the xor signal.

8. The circuit of claim 7, wherein the error detector is to determine the phase error based on the mark/space ratio of the xor signal by being configured to:
   perform a logic and operation between the xor signal and an uncorrelated clock signal to generate a first count signal;
   perform a logic and operation between an xorb signal and the uncorrelated clock signal to generate a second count signal, the xorb signal being an inverted version of the xor signal; and
   determine the phase error between the first and second signals based on a difference between a first number of transitions in the first count signal and a second number of transitions in the second count signal.

9. An apparatus, comprising:
   means for performing a logic XOR operation between first and second input signals to generate an xor signal;
   means for performing a logic AND operation between the xor signal and a clock signal to generate a first count signal;

means for performing a logic AND operation between an xorb signal and the clock signal to generate a second count signal, the xorb signal being an inverted version of the xor signal; and means for determining a phase error between the first and second input signals based on a difference between a first number of transitions in the first count signal and a second number of transitions in the second count signal.

10. The apparatus of claim 9, wherein the means for determining the phase error includes:

means for counting a number of rising edges in the first count signal for a time period to obtain a first counter value;

means for counting a number of rising edges in the second count signal for a time period to obtain a second counter value; and means for determining the phase error between the first and second input signals based on a difference between the first and second counter values.

11. The apparatus of claim 10, further comprising means for generating an error code that indicates a magnitude and a sense of the determined phase error.

12. The apparatus of claim 11, further comprising:

means for determining whether a difference between the first and second counter values is greater than a threshold; and means for outputting the error code responsive to a determination that the difference is greater than the threshold.

13. The apparatus of claim 11, further comprising:

means for determining whether the first counter value or the second counter value is greater than a threshold; and means for outputting the error code responsive to a determination that the first counter value or the second counter value is greater than the threshold.

14. A circuit comprising:

an error detector to determine a phase error between a first input signal and a second input signal, the error detector including:

XOR logic to perform an XOR operation between the first and second input signals to generate an xor signal;

first AND logic to perform a logic AND operation between the xor signal and a clock signal to generate a first count signal;

second AND logic to perform a logic AND operation between an xorb signal and the clock signal to generate a second count signal, the xorb signal being an inverted version of the xor signal; and logic to determine a difference between a first number of transitions in the first count signal and a second number of transitions in the second count signal over a same time period to enable determination of the phase error.

15. The circuit of claim 14, wherein the clock signal is uncorrelated with the first and second input signals.

16. The circuit of claim 14, wherein the error detector further includes logic to generate an error code that indicates a sense and magnitude of the phase error.

17. The circuit of claim 16, wherein the circuit further comprises a training controller coupled to the error detector, the training controller to adjust a delay of the first or second input signal based on the error code.

18. The circuit of claim 16, wherein the logic to generate the error code is to output the error code responsive to a determination that a difference between the first number of transitions and the second number of transitions is equal to or greater than a threshold.

19. The circuit of claim 16, wherein the logic to generate the error code is to output the error code responsive to a determination that the first number of transitions or the second number of transitions is greater than a threshold.

20. The circuit of claim 14, further comprising:

a first path to pass the first input signal;

a second path to pass the second input signal;

a supply modulator to modulate a supply voltage at a modulation frequency during a training process of the circuit, wherein the supply voltage is provided to one or more circuit blocks on the first path or second path;

a jitter equalizer to provide a delay to the first input signal or the second input signal;

a training controller coupled to the error detector and the jitter equalizer, the training controller to, while the supply voltage is modulated at the modulation frequency, adjust the delay provided by the jitter equalizer based on the determined phase error.

21. The circuit of claim 14, wherein the first input signal is a data signal and the second input signal is a clock signal.

22. The circuit of claim 20, wherein the first path and the second path are included in a transmit circuit that is to transmit the data signal.

* * * * *